US010229813B2

(12) United States Patent
Kawaguchi et al.

(10) Patent No.: US 10,229,813 B2
(45) Date of Patent: Mar. 12, 2019

(54) PLASMA PROCESSING APPARATUS WITH LATTICE-LIKE FARADAY SHIELDS

(71) Applicant: Hitachi High-Technologies Corporation, Minato-ku, Tokyo (JP)

(72) Inventors: Tadayoshi Kawaguchi, Tokyo (JP); Ryoji Nishio, Tokyo (JP); Tsutomu Tetsuka, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 838 days.

(21) Appl. No.: 14/447,608

(22) Filed: Jul. 30, 2014

(65) Prior Publication Data

US 2015/0311040 A1    Oct. 29, 2015

(30) Foreign Application Priority Data

Apr. 25, 2014    (JP) .................................. 2014-090828

(51) Int. Cl.
   *H01J 37/32*    (2006.01)
   *H05H 1/46*    (2006.01)

(52) U.S. Cl.
   CPC ...... *H01J 37/32091* (2013.01); *H01J 37/321* (2013.01); *H01J 37/32137* (2013.01); *H01J 37/32651* (2013.01)

(58) Field of Classification Search
   CPC .................. H01J 37/32137; H01J 37/32651
   See application file for complete search history.

(56) References Cited

U.S. PATENT DOCUMENTS 6,281,469 B1 * 8/2001 Perrin ............... H01J 37/32541
                                                     118/723 I
6,494,998 B1 * 12/2002 Brcka .................. H01J 37/321
                                                     118/723 I (Continued)

FOREIGN PATENT DOCUMENTS

JP    H8-078187 A      3/1996
JP    2004-235545 A    8/2004

(Continued)

OTHER PUBLICATIONS

Office Action dated Jul. 14, 2017 for related Japanese Application No. 2014-090828.

*Primary Examiner* — Karla A Moore
*Assistant Examiner* — Laureen Chan
(74) *Attorney, Agent, or Firm* — Miles & Stockbridge P.C.

(57) ABSTRACT

In a plasma processing apparatus including a processing chamber, a dielectric window for hermetically sealing the upper portion of the processing chamber, an induction antenna deployed above the dielectric window, a Faraday shield unit, and a control apparatus for controlling a first radio-frequency power source for supplying a radio-frequency power to the induction antenna, and a second radio-frequency power source for supplying a radio-frequency power to the Faraday shield unit, the Faraday shield unit includes a first Faraday shield having a first element, and a second Faraday shield having a second element deployed at a position adjacent to the first element, the control apparatus applying a time modulation to the radio-frequency powers that are respectively supplied to the first element and the second element, the phase of the first-element-supplied and time-modulated radio-frequency power being different from (Continued)

the phase of the second-element-supplied and time-modulated radio-frequency power.

5 Claims, 11 Drawing Sheets

(56) References Cited

U.S. PATENT DOCUMENTS

| | | | | |
|---|---|---|---|---|
| 2004/0194890 A1* | 10/2004 | Moroz | ............. | H01J 37/32082 |
| | | | | 156/345.48 |
| 2005/0103445 A1* | 5/2005 | Brcka | ................... | H01J 37/321 |
| | | | | 156/345.48 |
| 2007/0074815 A1* | 4/2007 | Ohkuni | ..................... | C23F 4/00 |
| | | | | 156/345.47 |
| 2009/0294061 A1* | 12/2009 | Shannon | ........... | H01J 37/32091 |
| | | | | 156/345.24 |
| 2011/0297320 A1* | 12/2011 | Sakka | ................... | H01J 37/321 |
| | | | | 156/345.48 |
| 2012/0267050 A1* | 10/2012 | Sakka | ............... | H01J 37/32119 |
| | | | | 156/345.39 |

FOREIGN PATENT DOCUMENTS

| | | |
|---|---|---|
| JP | 2007-046160 A | 2/2007 |
| JP | 2011-253916 A | 12/2011 |
| JP | 2014-072508 A | 4/2014 |

\* cited by examiner

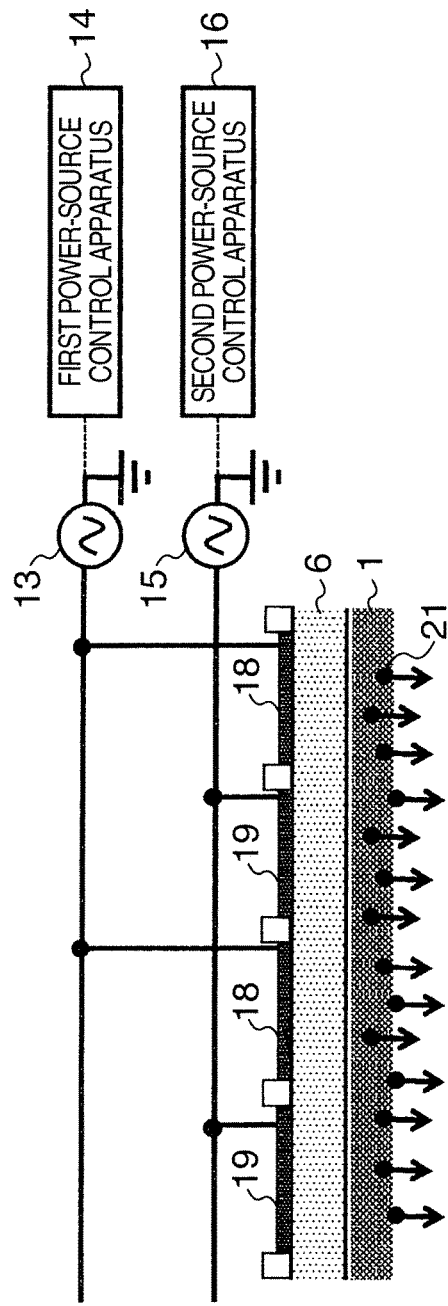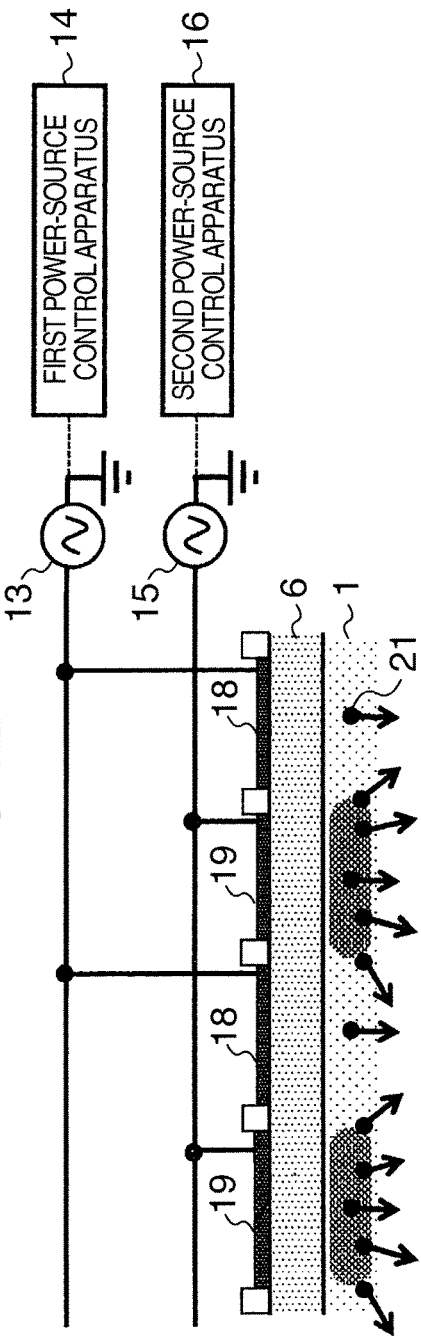

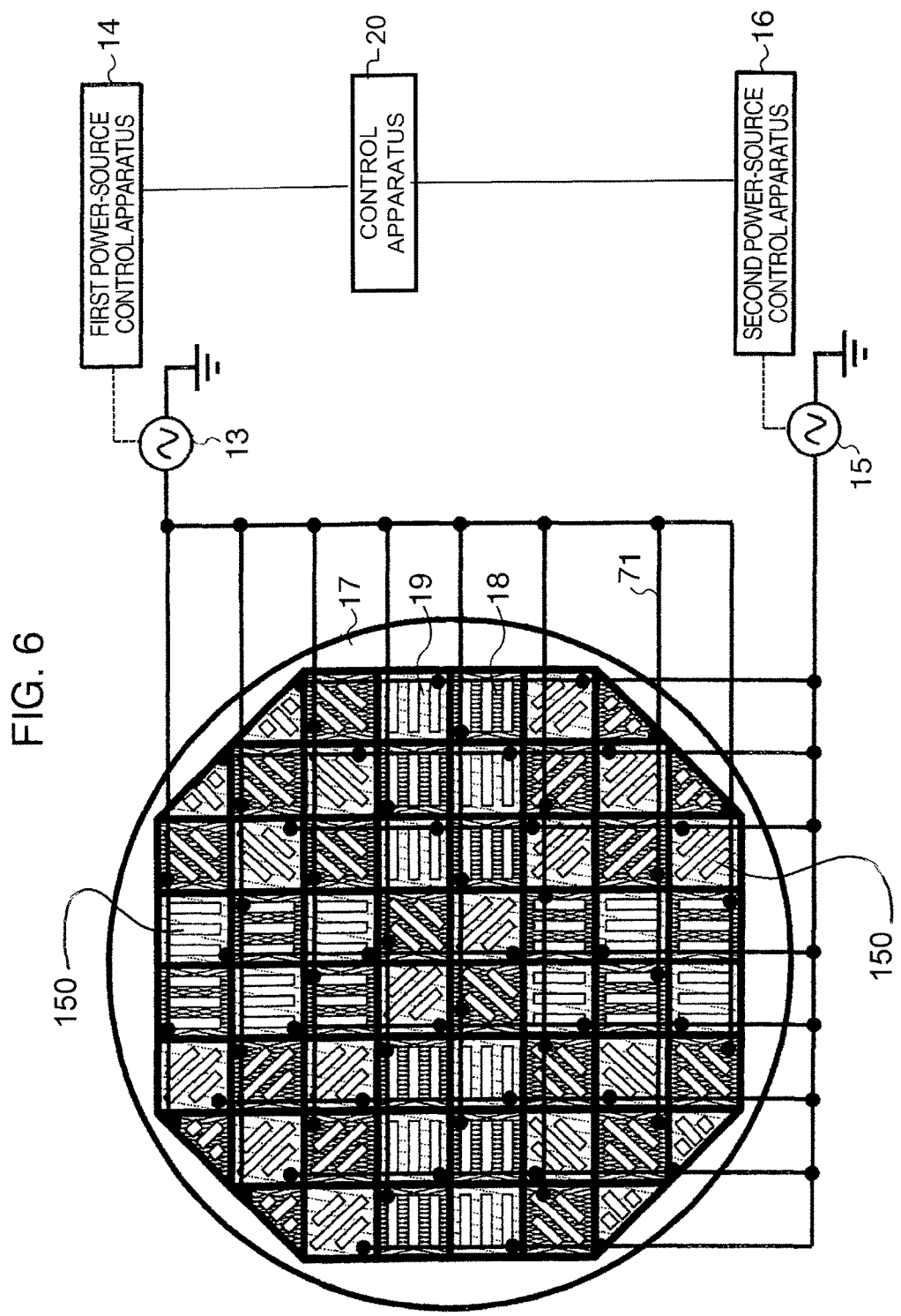

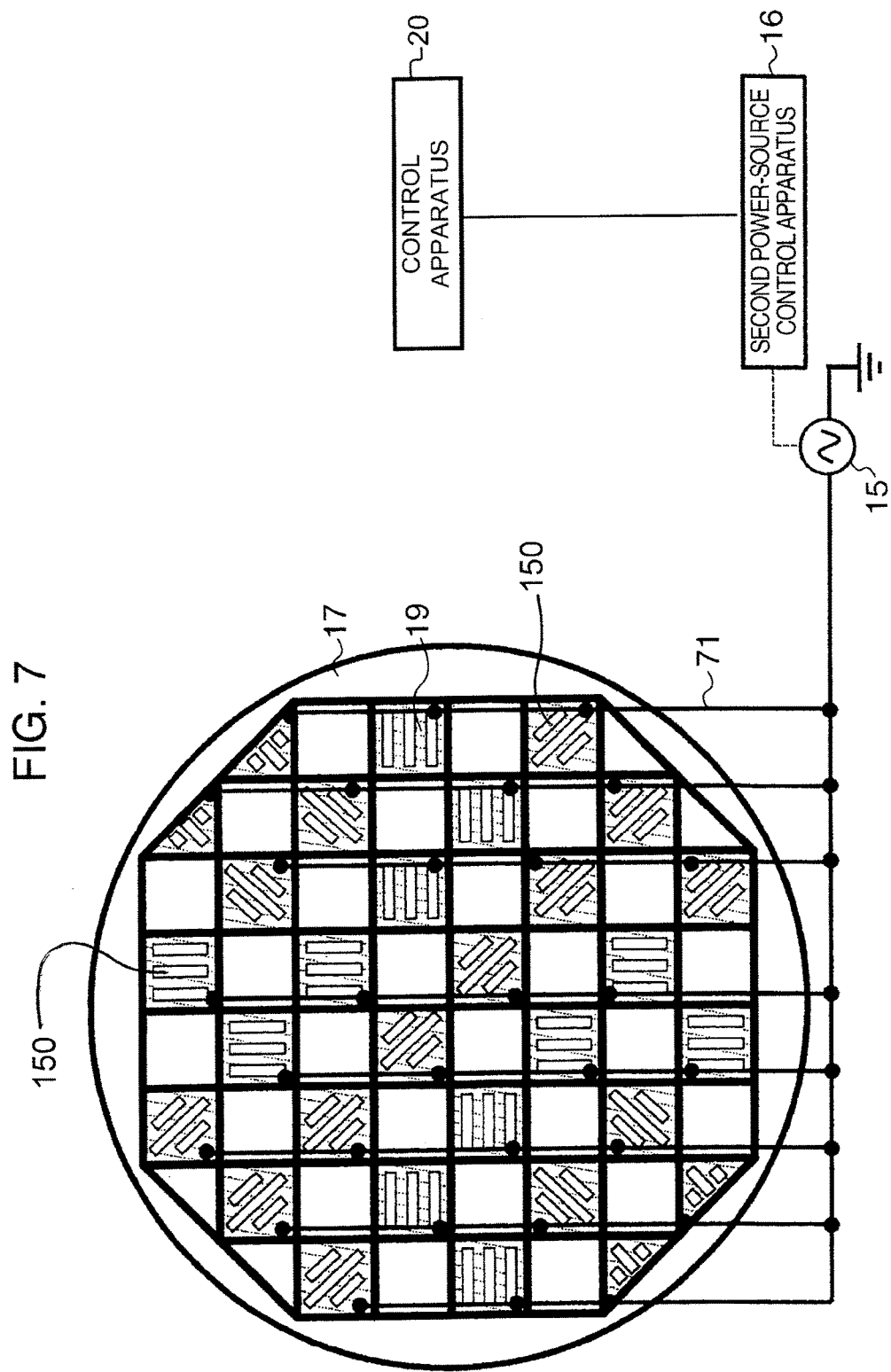

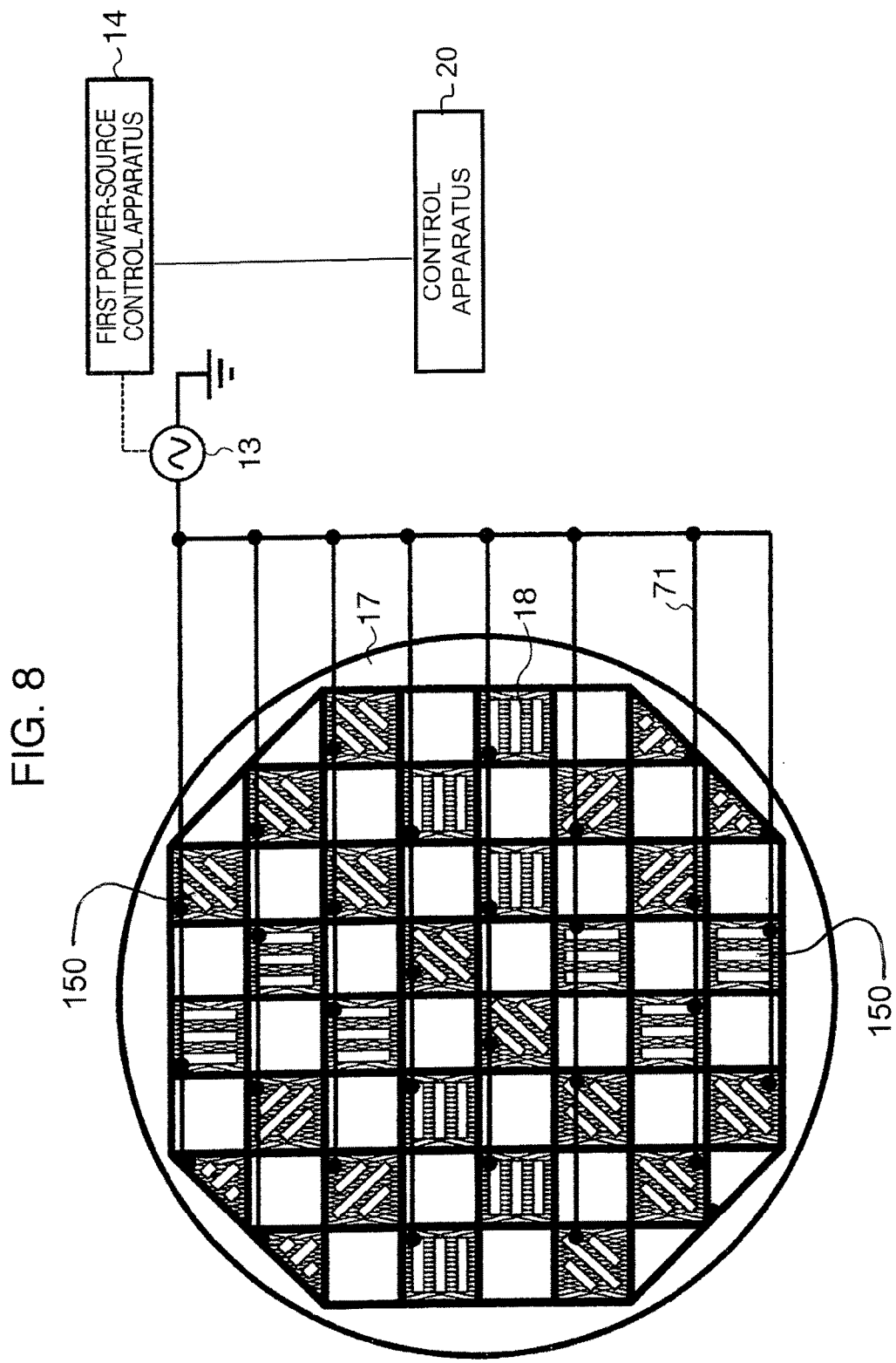

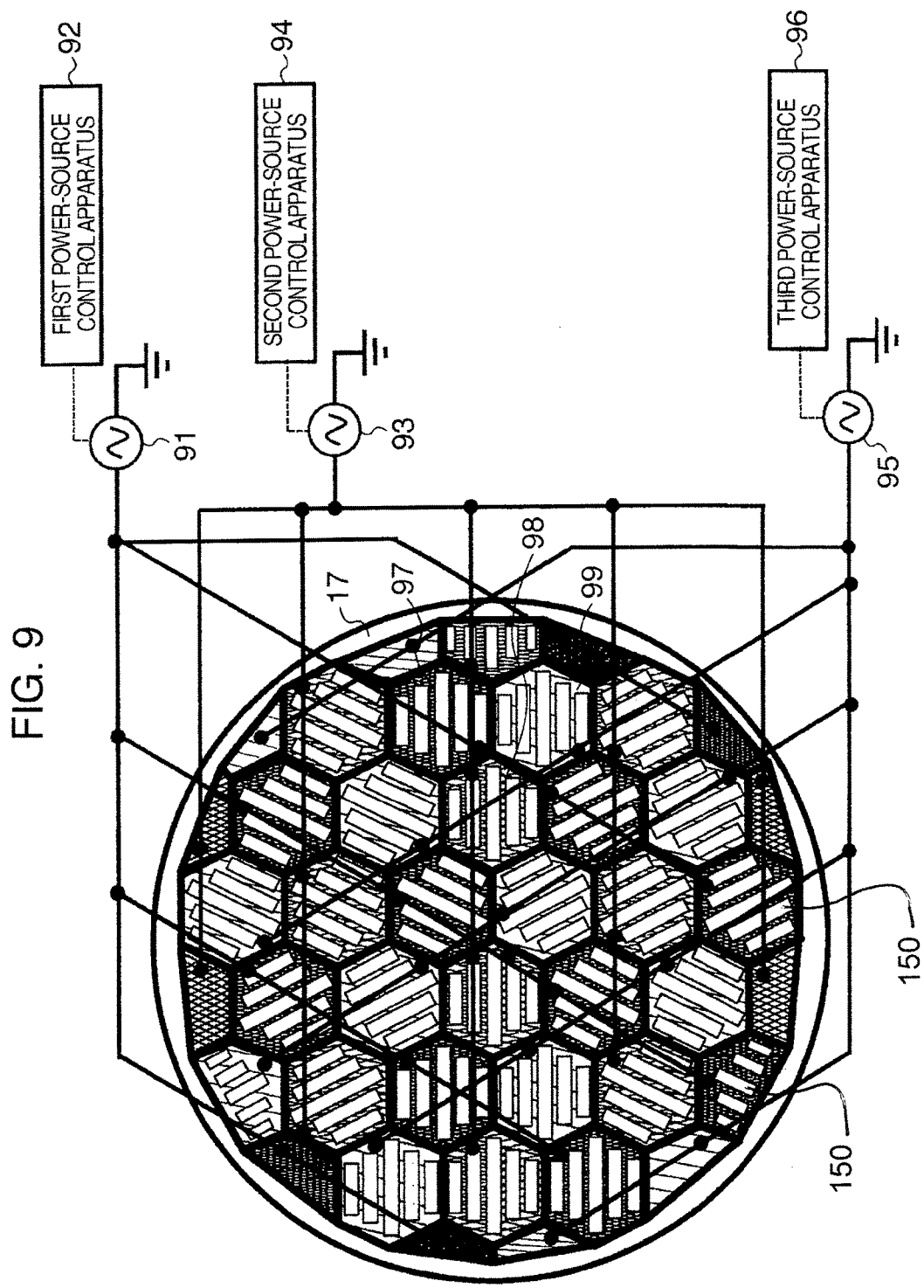

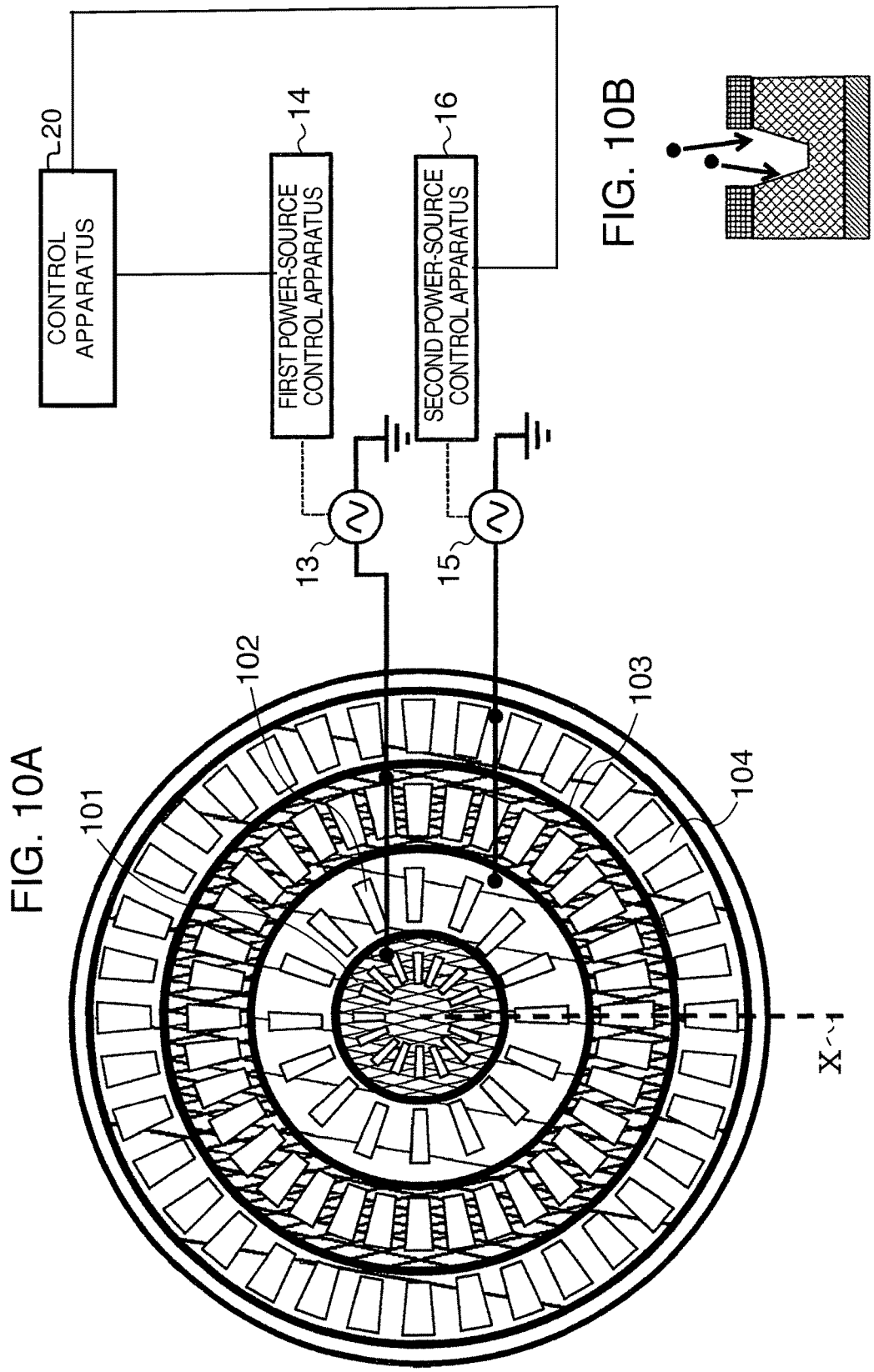

PLASMA PROCESSING APPARATUS WITH LATTICE-LIKE FARADAY SHIELDS

BACKGROUND OF THE INVENTION

The present invention relates to a plasma processing apparatus for performing the etching of a substrate and the surface processings such as thin-film formation by using plasma. More particularly, it relates to an inductively-coupled plasma processing apparatus.

Of the today's semiconductor-device markets, the non-volatile RAM (Random Access Memory) market is now expanding. Above all, such non-volatile RAMs as FeRAM (Ferroelectric Random Access Memory) and MRAM (Magnetic Random Access Memory) are under enthusiastic development in each company. This is because FeRAM and MRAM have advantages in their low power consumption and high-speed operation.

The mass production of FeRAM and MRAM requires the etching of non-volatile materials such as PZT (Lead Zirconate Titanate) for FeRAM and CoFe for MRAM. As the units for etching these non-volatile materials, for example, an inductively-coupled plasma processing apparatus is used in the semiconductor-device fabrication field. In this inductively-coupled plasma processing apparatus, a process gas is inserted into a plasma processing chamber. Moreover, plasma is generated from this process gas by causing a radio-frequency current to flow along an induction coil that is deployed outside the plasma processing chamber.

This inductively-coupled plasma processing apparatus is based on the following scheme: The power is supplied to the plasma in such a manner that an induced current is induced in the plasma by causing the radio-frequency current to flow along the induction coil deployed outside the plasma processing chamber. This scheme commonly prevails, because it allows implementation of the plasma processing apparatus whose apparatus configuration is comparatively simple. Furthermore, the merits resulting from utilizing the plasma are as follows: The promotion of chemical reactions by high-energy electrons becomes implementable, and directivity-equipped processings become implementable by irradiating a process plane on the wafer surface with high-energy ions.

As this inductively-coupled plasma processing apparatus, a plasma processing apparatus is used which is disclosed in JP-A-2004-235545. As is exactly disclosed in JP-A-2004-235545, a cone-shaped and dielectric-composed bell-jar, which constitutes the upper portion of the plasma processing chamber, is set up in this chamber. Moreover, an induction coil for generating plasma is set up on the upper portion of this bell-jar. A cone-shaped Faraday shield is set up between the bell-jar and the induction coil. Applying a high voltage to this Faraday shield makes it possible to control reaction byproducts that adhere onto the inner wall of the bell-jar.

Also, as a similar plasma processing apparatus, a plasma processing apparatus is used which is disclosed in JP-A-2011-253916 (corresponding to U.S. Patent Publication No. 2011/297320). JP-A-2011-253916 is constituted based on a similar structure to JP-A-2004-235545. Namely, divided Faraday shields are set up between the dielectric-composed bell-jar and the plasma-generation-use induction coil. The voltage control over these divided Faraday shields can be performed independently of each other. This condition makes it possible to control the reaction byproducts more accurately. The use of these divided Faraday shields allows implementation of the processing apparatus that is superior in the mass-production property and the etching performance.

SUMMARY OF THE INVENTION

In recent years, in the semiconductor-device fabrication field, there has been a significant request for the larger-diameter implementation and higher-integration implementation of a wafer, i.e., the member to be processed. In accompaniment with this request, in order to process the wafer in the plasma processing apparatus, there has been a significant request for the uniformity of the plasma to be generated and the vertical implementation of the etch profile. In particular, in the etching of the non-volatile materials, the volatile property of the materials to be etched is low. This condition causes the reaction byproducts, which are produced by the etching, to adhere onto the side-wall portion of the etch profile. As a result, it has been recognized that the vertical etch profile is difficult to implement.

FIG. 3 illustrates a schematic diagram of the plasma etching processing. In order to pull in ions 21 into a wafer 3 from plasma 1, a radio-frequency power (whose frequency ranges from 400 kHz to a few tens of MHz) is applied to the plasma from an electrode-use radio-frequency power source 7. At this time, the radio-frequency power is applied by the amount of a few tens of W to a few kW. This power application gives rise to the occurrence of an electric field in a sheath region 31 between the wafer 3 and the plasma 1. As a result, each ion 21, whose mass is larger as compared with the electron mass, is accelerated mainly by the DC-voltage component $V_{dc}$ (V) of the electric field. The electric field to which each ion actually responds depends on the frequency of the radio-frequency power to be applied. For example, if the frequency is equal to a few hundreds of kHz, each ion responds to the radio-frequency component of the electric field as well to some extent. In the case of a general radio-frequency power source (13.56 MHz), however, each ion is accelerated by the DC-voltage component (V). The ion velocity U of each ion that is accelerated in the wafer direction by the electric-potential difference $V_{de}$ is given by the following Expression (1):

$$U = \sqrt{(2eV_{dc}/M)} \quad (1)$$

e: electron charge ($1.6022 \times 10^{-19}$ C)
M: ion mass

Under this condition, a to-be-etched film 36 is subjected to the plasma etching with a mask film 35 as its cover. At this time, each ion enters the wafer position with an angle that is substantially perpendicular thereto. In accompaniment with the development of the etching, the incident angle θ of each ion that is entering the side-wall portion 37 of the etch profile comes nearer to 90°. As a result, the sputtering efficiency becomes steeply lowered, and thus the profile of the side-wall portion 37 becomes a taper profile. In particular, in the etching of the non-volatile materials, the volatile property of the materials to be etched is low. This condition causes the reaction byproducts, which are produced by the etching, to adhere onto the side-wall portion 37, thereby making it likely that the profile of the side-wall portion will become the taper profile even further. When the profile has become the taper profile, the pattern including the etch profile comes into contact with a pattern adjacent thereto, thereby giving rise to the short-circuit between these patterns. This short-circuit worsens the device characteristics.

Accordingly, in view of the above-described problem, the present invention provides a plasma processing apparatus that makes it possible to accomplish the vertical implementation of the etch profile in the plasma processing apparatus for performing the plasma etching of the non-volatile materials.

The present invention provides a plasma processing apparatus including a processing chamber where a sample is subjected to a plasma processing, a dielectric window for hermetically sealing the upper portion of the processing chamber, an induction antenna deployed above the dielectric window, a Faraday shield unit deployed between the induction antenna and the dielectric window, and performing a capacitive coupling with the plasma, and a control apparatus for controlling a first radio-frequency power source and a second radio-frequency power source, the first radio-frequency power source being used for supplying a radio-frequency power to the induction antenna, the second radio-frequency power source being used for supplying a radio-frequency power to the Faraday shield unit, wherein the Faraday shield unit includes a first Faraday shield and a second Faraday shield, the first Faraday shield including a first element where slits are deployed, the second Faraday shield including a second element which is deployed at a position adjacent to the first element and where slits are deployed, the control apparatus applying a time modulation to the radio-frequency powers that are respectively supplied to the first element and the second element, the phase of the first-element-supplied and time-modulated radio-frequency power being different from the phase of the second-element-supplied and time-modulated radio-frequency power.

According to the present invention, it becomes possible to accomplish the vertical implementation of the etch profile in a plasma processing apparatus for performing the plasma etching of the non-volatile materials.

Other objects, features and advantages of the invention will become apparent from the following description of the embodiments of the invention taken in conjunction with the accompanying drawings.

BRIEF DESCRIPTION OF THE DRAWINGS

FIGS. 2A and 2B are schematic diagrams for illustrating the relationship between the phases of radio-frequency powers applied to the Faraday shields of respective systems, and the plasma distribution;

FIG. 6 is a diagram for illustrating the configuration of the Faraday shields of two systems;

FIG. 7 is a diagram for illustrating the configuration of second Faraday shields;

FIG. 8 is a diagram for illustrating the configuration of first Faraday shields;

FIG. 9 is a diagram for illustrating the configuration of the Faraday shields of three systems;

FIG. 10A is a diagram for illustrating the configuration of the radial-direction Faraday shield, and FIG. 10B is a partially cross-sectional diagram of FIG. 10A.

DETAILED DESCRIPTION OF THE EMBODIMENT

Figure 1:
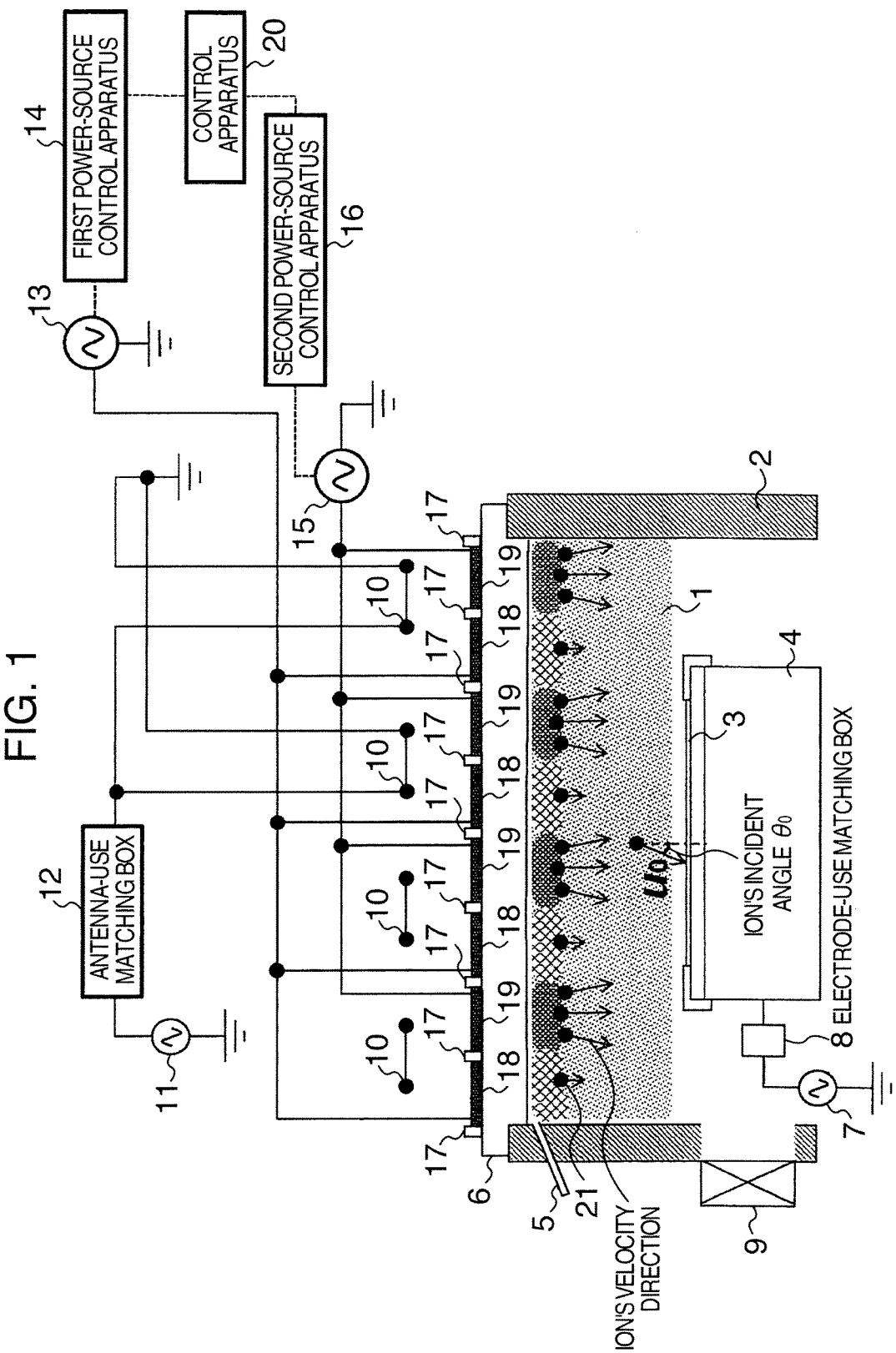
FIG. 1 is a cross-sectional diagram for illustrating the overview of a plasma processing apparatus according to the present invention.
Figure 3:
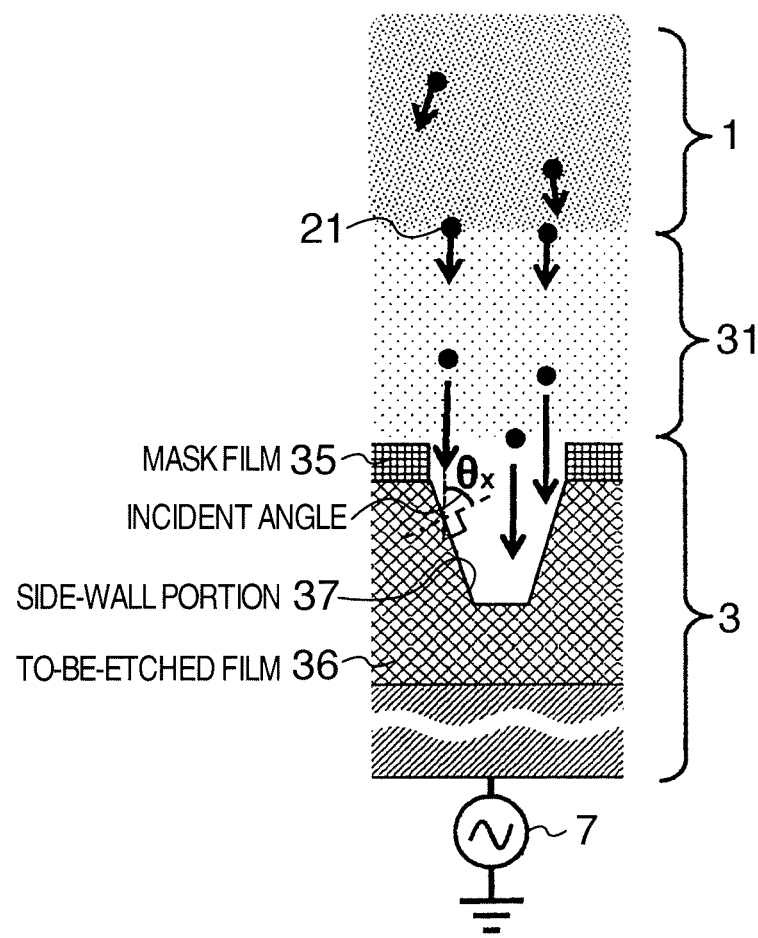
FIG. 3 is the schematic diagram for illustrating the relationship between the incident angle of each ion entering the wafer, and the etch profile.

Hereinafter, referring to the drawings, the explanation will be given below concerning a plasma processing apparatus according to the present invention. FIG. 1 illustrates the cross-section of a plasma etching apparatus, which is the plasma processing apparatus according to the present invention.

A vacuum window 6 formed of an insulating material (e.g., quartz, alumina ceramics, etc) and a gas-supplying pipe 5 are deployed on the upper portion of a plasma processing chamber 2 for generating and confining plasma 1. A sample stage 4 for mounting thereon a wafer 3, i.e., the member to be processed, and an exhaust port 9 for performing vacuum exhaustion are deployed on the lower portion of the processing chamber 2. Coil-like induction antennas 10 are deployed outside the vacuum window 6. The induction antennas 10 are connected via an antenna-use matching box 12 to an antenna-use radio-frequency power source 11, which becomes the supply source of a radio-frequency power.

Also, first Faraday shields 18 and second Faraday shields 19 are deployed in a lattice-like manner (refer to FIG. 6) between the vacuum window 6 and the induction antennas 10. This lattice is formed using insulating plates 17 (e.g., quartz, alumina ceramics, etc), and the respective Faraday shields are deployed thereon so that the Faraday shields do not come into contact with each other.

Also, a first radio-frequency power source 13 and a second radio-frequency power source 15 are respectively connected to the first Faraday shields 18 and the second Faraday shields 19 independently of each other. A first power-source control apparatus 14 and a second power-source control apparatus 16, which control voltages or phases to be applied to the respective systems, are respectively connected to the first radio-frequency power source 13 and the second radio-frequency power source 15. The first power-source control apparatus 14 and the second power-source control apparatus 16 are controlled by a control apparatus 20.

Figure 5A:
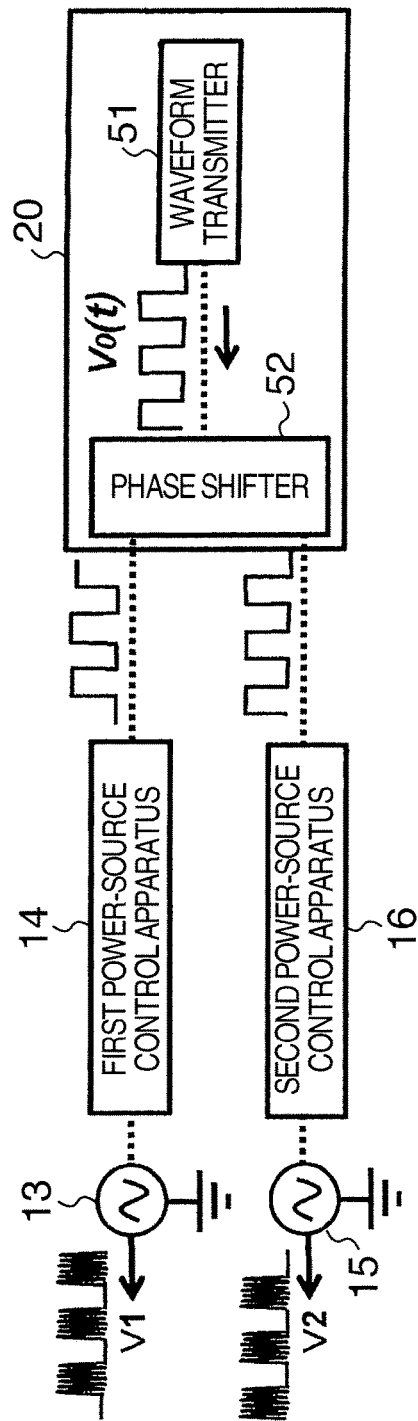
FIGS. 5A and 5B are schematic diagrams at the time when a time change is applied to the radio-frequency voltages applied to the Faraday shields of respective systems.
Figure 5B:
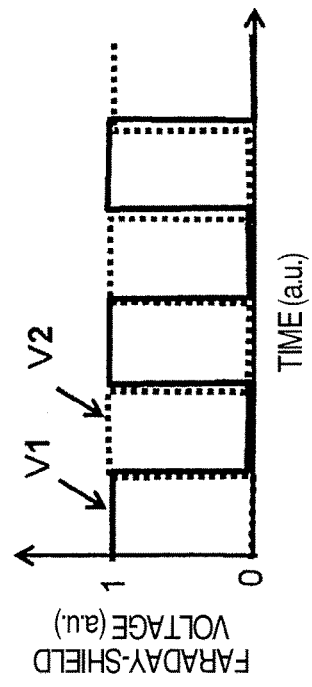

Here, referring to FIGS. 5A and 5B, the explanation will be given below concerning a method for applying a time change to the voltages outputted from the radio-frequency power sources 13 and 15. In FIG. 5A, for example, $V_0(t)$, which is a rectangular waveform, is given to a phase shifter 52 from a waveform transmitter 51. Moreover, from the phase shifter 52, signals whose phases are different from each other are respectively given to the first power-source control apparatus 14 and the second power-source control apparatus 16 between the respective systems. Furthermore, the signals inputted into the respective control apparatuses 14 and 16 are respectively given to the first radio-frequency power source 13 and the second radio-frequency power source 15. As illustrated in FIG. 5B, this method allows the voltages from the radio-frequency power sources 13 and 15 between the respective systems to be time-modulated by the rectangular waveform so that the radio-frequency power sources 13 and 15 output the voltages alternately. A technique like this makes it possible to time-change the voltages and the phase difference that are to be applied to the Faraday shields of the respective systems.

Incidentally, FIG. 5B illustrates the voltage V1 that is applied to the first Faraday shields 18 and is time-modulated, and the voltage V2 that is applied to the second Faraday shields 19 and is time-modulated. Also, the waveform $V_0(t)$, which is generated by the waveform transmitter 51, is not limited to the rectangular wave, but may also be such waves as triangular wave, pulse-like wave, and sinusoidal wave.

It is preferable that the value of the repeated frequency for allowing the voltages to be time-modulated is as follows: During a processing time (which ranges from a few seconds to a few minutes), this value is equal to at least 1 Hz or more. Also, its maximum value is equal to 50 kHz, taking into consideration that the repeated frequency is a low frequency to such an extent that a time change in the plasma distribution can follow this repeated frequency. The speed of the time change in the plasma distribution is limited by the velocity of each ion that is considerably slow. Here, the characteristic time of the time change in the plasma distribution is estimated briefly. The velocity of each ion when the time change in the plasma distribution is occurring is given by the following Expression (2) (which is referred to as "Bohm velocity"):

$$UB=\sqrt{(kT_e/M)} \quad (2)$$

k: Boltzmann constant ($1.3807 \times 10^{-23}$ J/K)
e: electron charge ($1.6022 \times 10^{-19}$ C)
$T_e$ electron temperature (K)
M: ion mass (kg)

Here, chlorine (mass number 35) that is commonly used in etching processes is used as the species of each ion, and 5 eV (58000 K) is selected as an example of the electron temperature. Calculating the Bohm velocity UB under these conditions results in UB=3700 (m/s). Assuming that the characteristic distance L over which the plasma distribution in the present invention exhibits the time change is equal to about 0.1 (m), the characteristic time T during which each ion displaces to change the plasma distribution is estimated by T=L/UB, which becomes equal to 27 μs. Accordingly, the frequency to which each ion is capable of responding becomes equal to 37 kHz (1/27 μs).

Consequently, it turns out that, at a frequency higher than this frequency, each ion is incapable of following the time change in the plasma distribution. On account of this, in association with the voltages and the phases to be applied to the Faraday shields for changing the position of the plasma generation in time, the repeated frequency for allowing the time modulation is required to be made equal to a few tens of kHz or less. The frequency to which each ion responds depends on the species (mass) of each ion. Accordingly, this frequency becomes equal to 55 kHz for oxygen. Although this frequency depends on the electron temperature as well, it can be estimated as being substantially 50 kHz as the limitation frequency of the response frequency. Also, although the time-modulation-use waveform is basically the sinusoidal wave, this waveform is permitted to be arbitrary within a range that allows the control over the matching circuit.

Furthermore, until here, the explanation has been given selecting the two systems as the example. In the case of the three or more systems, similarly, the absorption position of the radio-frequency waves is sequentially time-changed by shifting the timing with which the phase difference among the respective systems is time-changed. For example, it is advisable enough to shift the timing by 120° in the case of the three systems, 90° in the case of the four systems, and 60° in the case of the six systems. Namely, it is advisable enough to shift the timing by (360/N)° in the case of the N systems, where N is a natural number.

The plasma generation method using the above-described plasma processing apparatus is as follows: An induced current is caused to flow on the lower side of the vacuum window 6 by applying the radio-frequency power to the radio-frequency induction antennas 10. This induced current heats the electrons, thereby generating and maintaining the plasma. Also, the capacitively-coupled plasma is formed by applying the radio-frequency voltages to the Faraday shields. Meanwhile, a radio-frequency power source 7 is connected via an electrode-use matching box 8 to the wafer 3, i.e., the member to be processed. By applying the radio-frequency wave (whose frequency ranges from, e.g., 400 kHz to a few tens of MHz) to the wafer 3, the ions are extracted from the plasma, and the wafer 3 is irradiated therewith.

Next, FIG. 6 illustrates the profile and deployment of the Faraday shields according to the present invention. The deployment of the second Faraday shields 19 illustrated in FIG. 7 and the deployment of the first Faraday shields 18 illustrated in FIG. 8 are implemented as follows: The Faraday shields of the two systems are deployed in a lattice-like manner in order to change the plasma distribution in a two-dimensional manner within the wafer surface. The connection among the Faraday shields is implemented using wirings 71 such as conductive plates. Also, the Faraday shields of the two systems are deployed in a state of being isolated from each other using the insulating plates 17 (e.g., quartz, alumina ceramics, etc). This is performed so that the respective Faraday shields do not come into contact with each other. The voltages or phases from the first Faraday shields 18 are controlled by the first power-source control apparatus 14, and the voltages or phases from the second Faraday shields 19 are controlled by the second power-source control apparatus 16. Also, within each of the first Faraday shields 18 and the second Faraday shields 19, slits 150 are deployed in the radial directions thereof. This is performed in order to shield and prevent the radio-frequency voltages from the induction antennas 10 from being capacitively coupled with the plasma 1.

Next, the explanation will be given below concerning the reason why the above-described plasma processing apparatus makes it possible to accomplish the vertical implementation of the etch profile. FIGS. 2A and 2B illustrate the relationship between the phases of the voltages applied to the Faraday shields of the respective systems, and the plasma distribution. When the phase difference between the voltages applied to the first Faraday shields 18 and the second Faraday shields 19 is equal to 0°, as illustrated in FIG. 2A, the capacitively-coupled plasma is generated over the entire surface on the lower side of the vacuum window 6. Meanwhile, when the phase difference is substantially equal to 180°, as illustrated in FIG. 2B, the voltages are applied to the first Faraday shields 18 and the second Faraday shields 19 alternately. As a result, the capacitively-coupled plasmas are generated alternately on the lower surface of the vacuum window 6 under the Faraday shields 18 and 19 to which the voltages are applied.

In this way, the plasma distribution can be controlled using the phase difference between the voltages applied to the first Faraday shields 18 and the second Faraday shields 19. Moreover, in the case of the plasma that are generated as illustrated in FIG. 2B, the gradient of the plasma density is caused to occur within the generated plasma. Here, the generated ions 21 are accelerated by an ambipolar electric field E that is proportional to the gradient of the plasma density. Accordingly, the generated ions 21 are accelerated and spread in the velocity directions that are perpendicular to the contour lines of the plasma density distribution. Incidentally, the ambipolar electric field E is given by the following Expression (3):

$$E = -(kT_e/e)\nabla n/n \tag{3}$$

k: Boltzmann constant ($1.3807 \times 10^{-23}$ J/K)
e: electron charge ($1.6022 \times 10^{-19}$ C)
$T_e$: electron temperature (K)
n: electron density (1/cm$^3$)

Figure 4A:
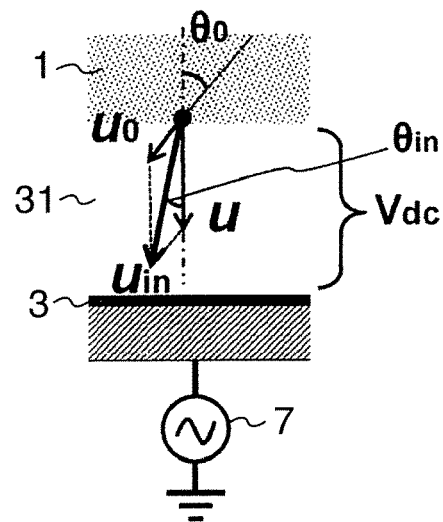
FIGS. 4A and 4B are schematic diagrams for illustrating the relationship among velocity vectors of each ion entering the wafer, and the effect exerted on the etch profile when the incident angle of each ion is changed.

Next, the explanation will be given below concerning the behavior of each ion 21 within the sheath region 31, and the etch profile, which are implemented by the plasma processing apparatus of the present invention. FIG. 4A illustrates the velocity vectors of each ion when each ion enters the sheath region. The velocity vector $U_{in}$ of each ion within the sheath region is determined by the sum total of the velocity vector that is spread by the ambipolar electric field E resulting from the gradient of the plasma density, and the velocity vector that results from the DC-voltage component $V_{dc}$ (V) within the sheath region. The incident angle $\theta_{in}$ of each ion when it enters the wafer 3 is given by the following Expression (4), letting the velocity of each ion immediately before it enters the sheath be $U_0$, the incident angle of each ion when it enters the sheath be $\theta_0$, and the velocity of each ion accelerated in the wafer direction by the DC-voltage component $V_{dc}$ (V) within the sheath be U:

$$\theta_{in} = \tan^{-1}(U_0 \tan \theta_0/U) \tag{4}$$

Here, the incident angle $\theta_0$ of each ion when it enters the sheath is calculated by assuming the following case as an example therefor: The electron temperature: 5 eV (58000 K), the electron density of the plasma generated by applying the voltages to the Faraday shields: $1.0 \times 10^{11}$ (1/cm$^3$), the electron density of the regions where the voltages are not applied to the Faraday shields: $1.0 \times 10^7$ (1/cm$^3$), and the DC-voltage component $V_{dc}$: 100 (V) to 300 (V). As a result of this calculation, the incident angle $\theta_0$ becomes equal to a range of 8.7° to 24.7°. Meanwhile, the conventional etch profile is equipped with the taper angle of about 80°. Accordingly, it is conceivable that the incident angle $\theta_0$ of each ion is an incident angle that is capable of making the etch profile sufficiently vertical.

Figure 4B:
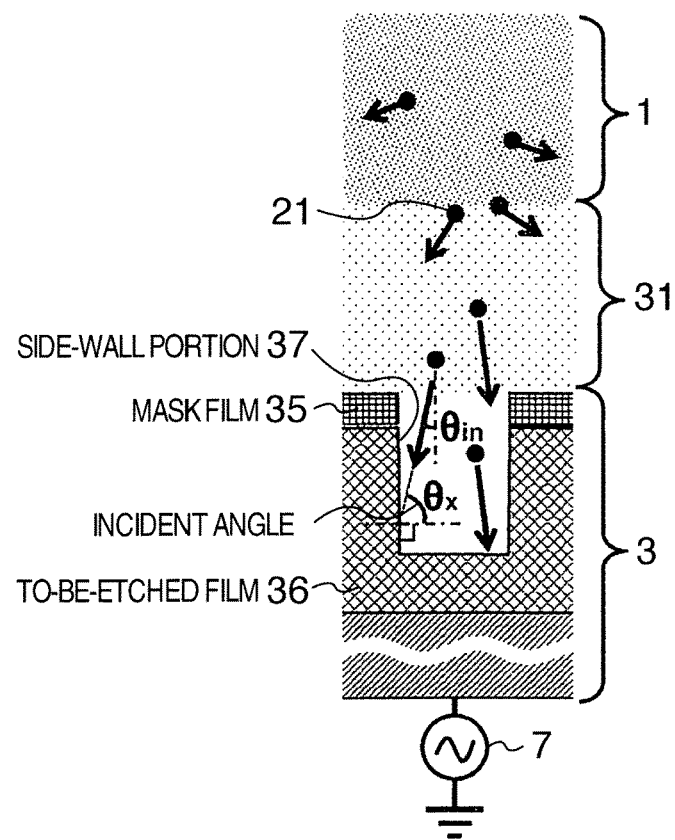

Next, FIG. 4B illustrates a schematic diagram of the plasma etching processing. From the above-described explanation, each ion enters the wafer 3 with the incident angle $\theta_{in}$ that is given by the Expression (4). At this time, the incident angle $\theta_x$ of each ion that is entering the to-be-etched film 36 becomes smaller than 90°. As a result, the sputtering efficiency is not lowered. This fact allows the vertical implementation of the etch profile to be accomplished by making suitable and effective the voltage and phase that are to be applied to each of the first Faraday shields 18 and the second Faraday shields 19.

In other words, the present invention makes it possible to give the horizontal-direction energy to each ion before it enters the sheath. This feature makes it possible to cause each ion to enter the sheath obliquely. Moreover, each ion that has entered the sheath obliquely prevents the sputtering efficiency of the side-wall portion 37 from being lowered. This condition allows the implementation of the vertical etching of the non-volatile materials.

As having been described so far, in the present embodiment, the explanation has been given regarding the case where the Faraday shields of the two systems are used. Next, referring to FIG. 9, the explanation will be given below regarding the case where the Faraday shields of three systems are used. First Faraday shields 97, second Faraday shields 98, and third Faraday shields 99 are respectively Faraday shields whose fundamental elements are regularly-hexagonal Faraday shields. Also, these regularly-hexagonal Faraday shields, i.e., the fundamental elements of the first Faraday shields 97, the second Faraday shields 98, and the third Faraday shields 99 respectively, are deployed in a honeycomb-like manner.

Also, the voltages or phases of outputs from a first radio-frequency power source 91, a second radio-frequency power source 93, and a third radio-frequency power source 95 are controlled by a first power-source control apparatus 92, a second power-source control apparatus 94, and a third power-source control apparatus 96, then being supplied to the first Faraday shields 97, the second Faraday shields 98, and the third Faraday shields 99, respectively. Furthermore, within each of the first Faraday shields 97, the second Faraday shields 98, and the third Faraday shields 99, slits 150 are deployed in the radial directions thereof. This is performed in order to shield and prevent the radio-frequency voltages from the induction antennas 10 from being capacitively coupled with the plasma 1.

Also, according to the present invention, the profile and deployment of the fundamental elements that constitute the Faraday shields of the respective systems are implemented as follows: When the Faraday shields are of the two or four systems, it is preferable that the profile of the fundamental elements constituting the Faraday shields of the respective systems be a quadrangular profile, and that the fundamental elements be deployed in a lattice-like manner. Also, in the case of the three systems, it is preferable that the profile of the fundamental elements be a hexagonal profile, and that the fundamental elements be deployed in a honeycomb-like manner. In the case of the six systems, it is preferable that the profile of the fundamental elements be a triangular profile, and that these triangles be deployed in a hexagon-like manner, and further, be deployed in a honeycomb-like manner.

Also, actually, the plasma distribution depends on the profile and deployment of the fundamental elements constituting the Faraday shields of the respective systems. Accordingly, the performance of the plasma etching can be controlled based on the profile and deployment of the fundamental elements constituting the Faraday shields of the respective systems. On account of this, increasing the system number of the Faraday shields makes it possible to acquire the uniform etch profile.

In the present embodiment, the fundamental elements constituting the Faraday shields have been deployed in a lattice-like or honeycomb-like manner, for example. If, however, each etch profile is a taper profile in the radial direction like the cross-section (illustrated in FIG. 10B) along the dotted line X in FIG. 10A, the generation position of the plasma may be time-changed in the radial direction by deploying the Faraday shields in the radial direction alone as are illustrated in FIG. 10A. Concretely, the profile of a first Faraday shield 101 of the center is a circular profile. Moreover, a donut-like second Faraday shield 102 is deployed outside the first Faraday shield 101. A donut-like third Faraday shield 103 is deployed outside the second Faraday shield 102. A donut-like fourth Faraday shield 104 is deployed outside the third Faraday shield 103.

The power-feeding to the first Faraday shield 101 and the third Faraday shield 103 is performed in such a manner that the voltage or phase from the first radio-frequency power source 13 is controlled by the first power-source control apparatus 14. Also, the power-feeding to the second Faraday shield 102 and the fourth Faraday shield 104 is performed in such a manner that the voltage or phase from the second radio-frequency power source 15 is controlled by the second power-source control apparatus 16.

Figure 11A:
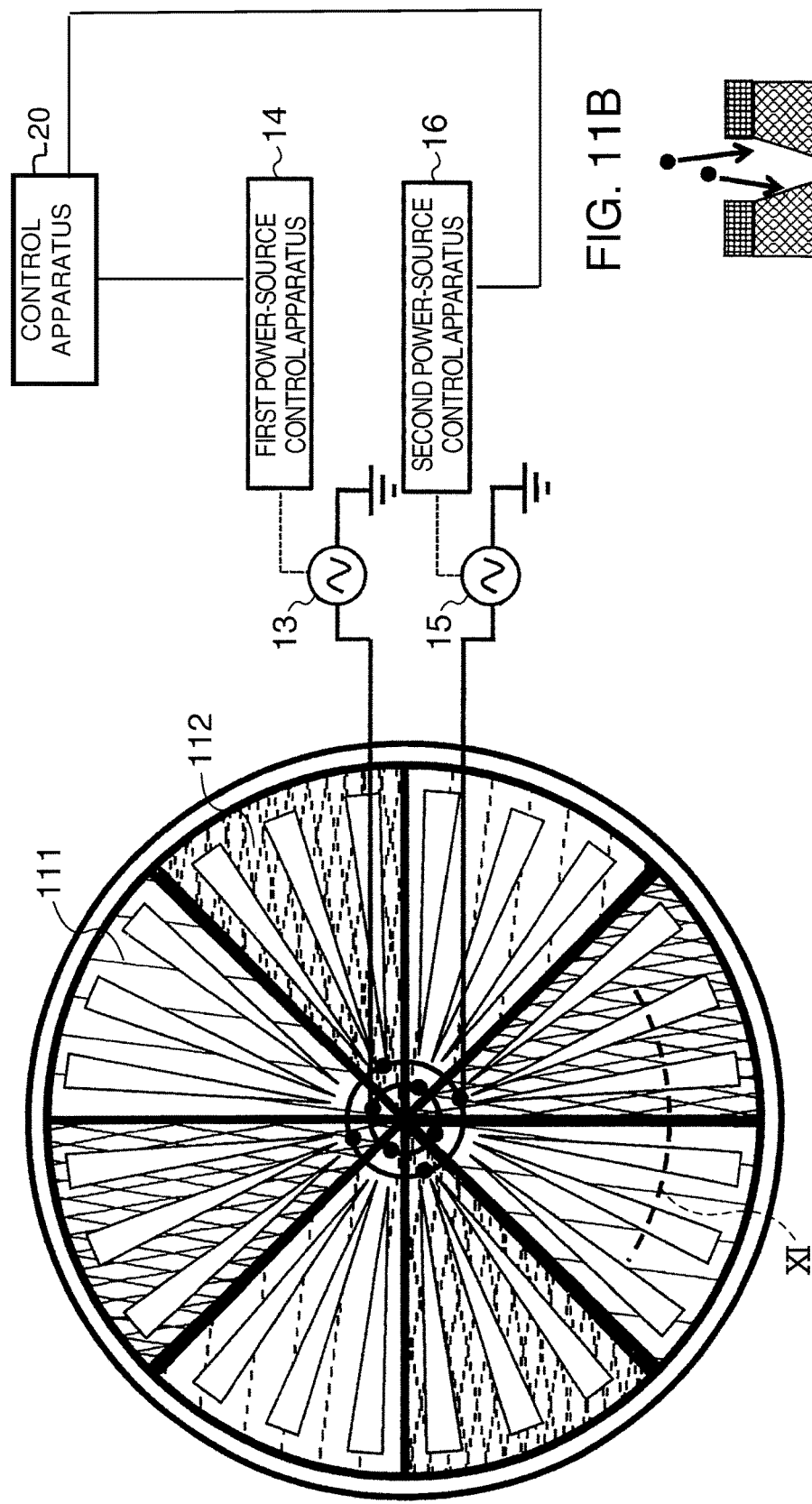
FIG. 11A is a diagram for illustrating the configuration of the circumferential-direction Faraday shield.
Figure 11B:
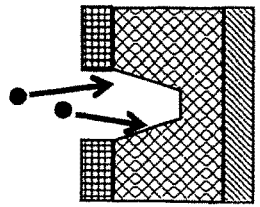
FIG. 11B is a partially cross-sectional diagram of FIG. 11A.

Also, if each etch profile is the taper profile in the circumferential direction like the cross-section (illustrated in FIG. 11B) along the dotted line XI in FIG. 11A, the generation position of the plasma may be time-changed in the circumferential direction by deploying the Faraday shields of the respective systems in the circumferential direction as are illustrated in FIG. 11A. Concretely, the profile of the Faraday shields of the respective systems is a circular-sector-like profile. Moreover, the Faraday shield illustrated in FIG. 11A is a Faraday shield that is constituted in such a manner that four circular-sector-like first Faraday shields ill and four circular-sector-like second Faraday shields 112 are deployed alternately.

Also, the power-feeding to the Faraday shields of the respective systems is performed as follows: The power-feeding is performed to one of the adjacent Faraday shields of the respective systems from the first radio-frequency power source 13. Also, the power-feeding is performed to the other Faraday shield of the adjacent Faraday shields of the respective systems from the second radio-frequency power source 15. Incidentally, the voltage or phase from the first radio-frequency power source 13 is controlled by the first power-source control apparatus 14, then being supplied to the Faraday shields of the respective systems. Also, the voltage or phase from the second radio-frequency power source 15 is controlled by the second power-source control apparatus 16, then being supplied to the Faraday shields of the respective systems.

As having been described so far, using the above-described plasma processing apparatus according to the present invention, the incident angle of each ion that is entering the wafer is made suitable and effective by time-changing the voltages and the phases to be applied to the Faraday shields of the two or more systems. Each ion whose incident angle has been made suitable and effective in this way allows the vertical implementation of the etch profile.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus, comprising:
   a processing chamber where a sample is subjected to a plasma processing;
   a vacuum window for hermetically sealing the upper portion of the processing chamber;
   an induction antenna deployed above the vacuum window;
   a planar Faraday shield unit deployed between the induction antenna and the vacuum window, and performing a capacitive coupling with the plasma, the Faraday shield unit comprising a first Faraday shield and a second Faraday shield; and
   a control apparatus configured to control a first radio-frequency power source and a second radio-frequency power source, the first radio-frequency power source supplying a radio-frequency power to the first Faraday shield, the second radio-frequency power source supplying a radio-frequency power to the second Faraday shield, wherein
   the first Faraday shield including a first element where slits are deployed, the second Faraday shield including a second element which is deployed at a position adjacent to the first element and where slits are deployed,
   the Faraday shield unit comprises a plurality of said first elements and a plurality of said second elements arranged in a lattice-like manner such that said plurality of first elements and said plurality of second elements are arranged alternatingly in a non-overlapping checkerboard or honeycomb pattern in a same plane of the Faraday shield unit such that no side of any one of said first element is disposed adjacent to any side of any other one of said first elements, and no side of any one of said second element is disposed adjacent to any side of any other one of said second elements,
   the control apparatus configured to apply a time modulation to the radio-frequency powers that are respectively supplied to the first element and the second element, and the control apparatus is further configured to change a difference between a first phase of the time-modulated radio-frequency power supplied to the first element and a second phase of the time-modulated radio-frequency power supplied to the second element with respect to time.

2. The plasma processing apparatus according to claim 1, wherein
   the first element and the second element are of a quadrangular profile, respectively.

3. The plasma processing apparatus according to claim 1, wherein the Faraday shield further comprises:
   a third Faraday shield including a third element which is deployed at a position adjacent to the first element and the second element, and where slits are deployed,
   the control apparatus applying the time modulation to a radio-frequency power supplied to the third element,
   the first element, the second element, and the third element being of a hexagonal profile, respectively.

4. The plasma processing apparatus according to claim 1, wherein
   a repeated frequency for applying the time modulation to the radio-frequency power supplied to the first element is a frequency which falls within a range of 1 kHz to 50 kHz, and
   a repeated frequency for applying the time modulation to the radio-frequency power supplied to the second element being a frequency which falls within the range of 1 kHz to 50 kHz.

5. The plasma processing apparatus according to claim 1, wherein
   the phase of the first-element-supplied time-modulated radio-frequency power is different from the phase of the second-element-supplied time-modulated radio-frequency power by the amount of substantially 180°.

* * * * *